United States Patent [19]

Dube et al.

[11] Patent Number: 5,011,565

[45] Date of Patent: Apr. 30, 1991

[54] DOTTED CONTACT SOLAR CELL AND METHOD OF MAKING SAME

[75] Inventors: Christopher E. Dube, Arlington; Ronald C. Gonsiorawski, Danvers, both of Mass.

[73] Assignee: Mobil Solar Energy Corporation, Billerica, Mass.

[21] Appl. No.: 524,346

[22] Filed: May 17, 1990

Related U.S. Application Data

[63] Continuation-in-part of Ser. No. 447,211, Dec. 6, 1989, abandoned.

[51] Int. Cl.$^5$ .................. B44C 1/22; C03C 15/00; C03C 25/06
[52] U.S. Cl. ........................... 156/643; 136/252; 156/644; 156/651; 156/657; 204/15; 219/121.69; 219/121.71; 437/2
[58] Field of Search ............... 156/643, 644, 651, 653, 156/657, 659.1, 662; 437/2, 3; 219/121.68, 121.69, 121.7, 121.71, 121.85; 204/15, 23, 24, 38.4; 136/249, 252, 256, 265

[56] References Cited

U.S. PATENT DOCUMENTS

| 4,691,077 | 9/1987 | Gregory et al. ............... 437/2 X |
| 4,703,553 | 11/1987 | Mardesich ..................... 437/2 X |
| 4,754,544 | 7/1988 | Hanak ............................. 437/2 |
| 4,818,337 | 4/1989 | Barnett et al. ................ 156/659.1 |

*Primary Examiner*—William A. Powell
*Attorney, Agent, or Firm*—Pandiscio & Pandiscio

[57] ABSTRACT

A method of applying metallized contacts to a solar cell substrate, the front surface of which is covered with a dielectric layer. The method involves forming a plurality of apertures extending through the dielectric layer using a laser beam and defining a grid-shaped electrode. The apertures comprise a plurality of microscopically-sized holes that are arranged in a series of rows, with the holes being spaced a relatively short distance from one another. Nickel is plated onto the portions of the substrate exposed through the apertures. The nickel plating is then overcoated with copper which is preferably applied by a contactless light-induced plating process. The copper plating process causes copper to be deposited so that it bridges over the dielectric layer between the holes so as to form an integrated grid electrode structure.

32 Claims, 3 Drawing Sheets

DOTTED CONTACT SOLAR CELL AND METHOD OF MAKING SAME

This application is a continuation-in-part of U.S. application Ser. No. 447,211, filed Dec. 6, 1989 for Method of Fabricating Solar Cells, now abandoned.

FIELD OF THE INVENTION

The present invention relates to an improved method of applying a metal contact to a semiconductor device and more particularly to an improved method of manufacturing solar cells.

BACKGROUND OF THE INVENTION

Photovoltaic solar cells are semiconductor devices that convert light energy to useful electrical energy. The typical solar cell comprises a semiconductor substrate having a P-N junction near its front energy-receiving surface, a grid-shaped ohmic contact or electrode and an anti-reflection ("AR") coating on that front energy-receiving surface, and a second ohmic contact or electrode on its rear surface.

Usually the solar cell is made of P-type silicon and a region of opposite conductivity type is formed by diffusion in the upper side of the substrate, whereby to create the junction. Commonly the opposite conductivity type region is an N+ region, so that the junction is an P-N+ junction. A shallow junction is preferred, the junction generally being located at a depth of about 0.5 microns below the front energy-receiving surface of the substrate. In such solar cells, electron-hole pairs are created by light entering the solar cell. These electron-hole pairs are then spatially separated by the junction, with the electrons travelling to the top surface where they are collected by the metal grid and the holes travelling to the bottom or back surface of the substrate where they are collected by the back contact.

The grid contact usually comprises a number of mutually spaced metal fingers (also known as "pickup bars") connected together by one or two metal bus bars. The electrons travel directly to the metal fingers or else travel in the direction of the upper surface and then travel along the upper surface to where they can be collected by the fingers.

The grid electrode may be made of various metals. Commonly it comprises a bottom layer of nickel, silver or some other highly conductive metal that is alloyed with the underlying substrate material. The bottom or back electrode also is alloyed to the substrate. It is commonly made of aluminum, but it could be made of silver or some other highly conductive metal. These electrodes usually are covered by and bonded to one or more overlying layers of other conductive metals (e.g., copper and tin) that are used to improve the quality of the electrode and/or facilitate connection of the electrode to an exterior circuit by soldering.

It is known that the AR coating may be applied after the grid contact has been formed. It also is known that the AR coating may be formed first. In the latter case the AR coating is formed so as to completely cover the front surface of the substrate. Then the grid contact is formed through the AR coating. This may be accomplished by firing a metal-containing paste through the AR coating. Alternatively it may be accomplished by first removing portions of the AR coating to expose portions of the front surface arranged in the pattern of a grid electrode, and then metallizing those exposed portions of the front surface to form a grid electrode in ohmic contact with the substrate.

The present invention relates to the manufacture of grid contacts by a method involving removal of portions of a previously applied dielectric coating so as to form a network of openings therein defining a grid-like pattern, and then metallizing the substrate through those openings so as to form a grid contact.

The prior art relating to grid electrode technology is exemplified by U.S. Pat. Nos. 3,686,036, 4,640,001, 4,451,969, 4,612,698, 3,811,954, 3,982,964, and 4,321,283, and also by R. A. Arndt et al, "Advances In High Output Voltage Silicon Solar Cells", Ch1644-4/81/0000-0092, 1981 IEEE; and Lindmayer et al, "The Violet Cell: An Improved Silicon Solar Cell", Comsat Tech Rev. Vol. 3, pp 1-22, Spring 1973.

Several attempts have been made to minimize the area of contact between the fine metallic fingers of the current-collecting grid electrode and substrate, for the purpose of improving solar cell efficiency. One method of reducing the metal-to-substrate area contact ratio is disclosed in U.S. Pat. No. 3,982,964 to Lindmayer et al. The Lindmayer et al. method involves chemically etching a plurality of parallel elongate apertures in the anti-reflection coating of a solar cell so as to expose portions of the top surface of the substrate. The anti-reflection coating may be tantalum oxide, niobium oxide, or oxides of Group VB metals. Then a plurality of fine, elongate metallic conductors, i.e., fingers or pickup bars, are deposited onto the anti-reflection coating so that they intersect the elongate apertures at a right angle. The conductors contact the exposed portions of the substrate only at the points of intersection of the apertures and the conductors. Hence the metal-to- substrate contact area ratio is the ratio of the area of the conductors in contact with the substrate to the overall area of the upper surface of the substrate. Although the Lindmayer et al. technique does result in a reduction in the grid electrode-to- substrate contact area ratio, the method is undesirably complex and time-consuming, requiring photolithography techniques to form the apertures and metal grid.

The Arndt et al article discloses essentially the same technique as the Lindmayer et al patent, except that the Arndt et al method utilizes about 8000 regularly spaced rectangular access holes each measuring 6.2×12.5 microns. Those holes are interconnected by the evaporative deposition of a Cr/Au alloy.

OBJECTS AND SUMMARY OF THE INVENTION

The primary object of this invention is to provide a new and improved method of making grid contacts for solar cells.

A further object of this invention is to provide a new and improved grid contact for a solar cell.

Another object of the present invention is to provide an improved method of forming a grid-type electrode on a solar cell which is relatively inexpensive, may be made reliably with a high throughput rate, and minimizes the ratio of (a) the area of the front surface of the substrate that is engaged by the grid contact to (b) the total area of the front surface of the substrate.

A more specific object of the present invention is to provide a method of making a grid-like electrode on a solar cell that involves formation of a layer of copper or another selected metal to connect a plurality of previously formed contact segments.

Still another specific object of the present invention is to provide a method of making electrical contacts on solar cells that involves light-induced plating ("LIP") of a layer of copper or another selected metal to connect a plurality of separately formed contact segments.

Another object of this invention is to provide a new and improved method of making grid contacts for silicon solar cells.

Another object of this invention is to provide a new and improved method of manufacturing silicon solar cells.

Still another object is to produce a solar cell having a grid electrode characterized by a relatively low ratio of metal contact area to total substrate upper surface area.

These and other objects are accomplished by a new method of forming a grid electrode on the front surface of a solar cell substrate (i.e., a substrate having a p/n junction therein) that is covered by a selected dielectric coating that can function as an AR coating. In the preferred embodiment of the invention, as a first step the dielectric coating is exposed to a laser beam of an intensity and for a duration sufficient to eliminate selected portions of the dielectric coating and expose the substrate underlying those selected portions, whereby the remaining dielectric coating generally defines a grid electrode pattern. The latter comprises a plurality of finger or pickup bar portions (as hereinabove described) and at least one bus bar portion that intersects the finger portions. The laser beam is controlled so that removal of at least some of the selected portions results in formation of a plurality of rows of microscopically-sized holes, with the holes in each row being spaced a selected distance from one another. While the holes may be spaced from one another by different amounts, it is preferred that the spacing between adjacent holes be uniform. If desired only the finger portions need comprise a plurality of small spaced holes, while the bus bar portion(s) may take the form of an elongated aperture in the dielectric layer. Preferably, however, like microscopic holes characterize the bus bar portion(s).

As a second step, a selected metal, such as nickel, is plated to those portions of the front surface that are exposed by the above-described laser-formed holes and apertures, so that each of the holes and apertures is filled with the selected metal.

Then, the substrate is subjected to a plating process in which a selected metal, preferably copper, is deposited onto the conductive metal deposits that fill the laser-formed holes and apertures. The copper or other selected metal is applied so that it not only coats the conductive metal deposits in the laser-formed holes and apertures but also extends over the AR coating between adjacent ones of the microscopically-sized holes so as to bridge and electrically connect the conductive metal deposits in those holes.

Preferably, but not necessarily, the copper is deposited by a contactless light-induced electrolytic plating technique which relies on the photovoltaic output of the substrate for sustaining an electrolytic plating reaction.

BRIEF DESCRIPTION OF THE DRAWINGS

In the various figures, like numerals designate like parts.

In order to facilitate understanding of the invention, at least some of the features and components illustrated in the drawings, in particular the depth of the junction and the relative thicknesses of the various layers on the substrate, as well as the spacing between and relative size of the small apertures formed in the dielectric layer on the substrate, are not drawn to scale.

DETAILED DESCRIPTION OF THE INVENTION

Figure 1:
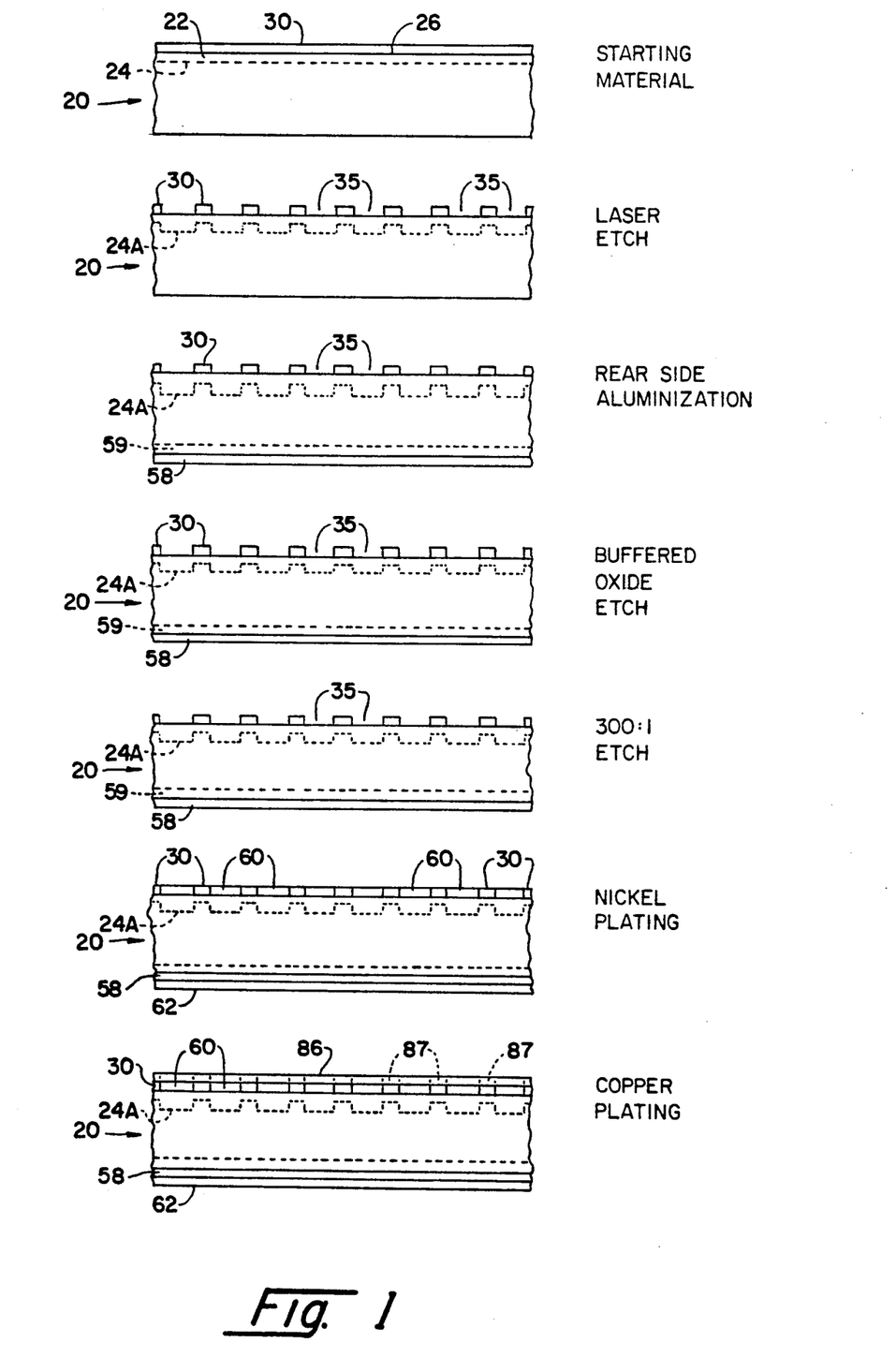
FIG. 1 schematically illustrates the steps of a preferred method of producing solar cells according to the present invention.

Referring to FIG. 1, the embodiment therein illustrated involves provision of a silicon substrate 20, such as the type made from P-type silicon ribbon grown by the EFG (edge-defined film fed growth) process, as the starting material. Preferably, substrate 20 comprises a relatively shallow N-type or N+-type conductivity region 22, whereby a P/N junction 24 is located about 0.5 microns below front surface 26. Exemplary diffusion conditions for creating such a P/N junction 24 are well known, as evidenced by U.S. Pat. No. 4,612,698 to Gonsiorawski et al. The upper (front) surface of the substrate is covered by a coating 30 of a dielectric which may be utilized as an AR coating, or as a base layer for a subsequently applied AR coating. Thus coating 30 may be formed of silicon nitride, silicon dioxide, or a glass such as a phosphorous ($P_2O_5$)-doped glass. Coating 30 may be deposited by various processes known to persons skilled in the art. Preferably coating 30 is made of silicon nitride and functions as an anti-reflection ("AR") coating. By way of example, but not limitation, coating 30 may be a silicon nitride formed by a plasma deposition process similar to the process described in U.S. Pat. No. 4,451,969 issued to A. R. Chaudhuri for "Method of Fabricating Solar Cells". Typically layer 30 will have a thickness in the range of about 700 to about 900 angstrom units.

Figure 3:
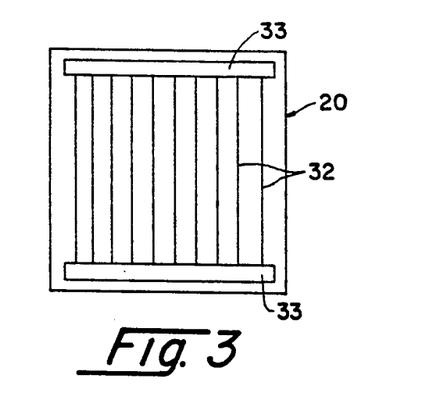
FIG. 3 is a plan view of the substrate, showing the gross shape of the grid electrode pattern formed in the dielectric coating by laser etching.

The invention is designed to produce a grid electrode in the form of a plurality of parallel narrow fingers or pickup bars and at least one relatively wide bus bar that intersects all of the fingers or pickup bars. Therefore, the first step in producing a grid electrode according to this invention is to form a suitable multi-fingered grid electrode plating pattern in outer coating 30. Referring now to FIG. 3, formation of the grid electrode plating pattern comprises removing portions of coating 30 to as to produce a plurality of openings arranged so as to generally define a plurality of narrow fingers or pickup bars 32 and at least one, but preferably two relatively wide bus bars 33 that intersects fingers 32. The narrow fingers are preferably spaced apart by a distance in the range of 1.0 to 5.0 mm. measured edge to edge.

The grid electrode pattern in coating 30 is preferably formed by laser action. Removal of portions of a dielectric coating by laser action, sometimes called "laser etching", is known and may be carried out with various types of lasers. By way of example, use of a laser to form an electrode pattern in a silicon nitride coating on a silicon solar cell is disclosed in co-pending U.S. Patent application Ser. No. 387854 filed 7/31/89 by Hanoka et al for "Method of Fabricating Solar Cells".

Figure 2:
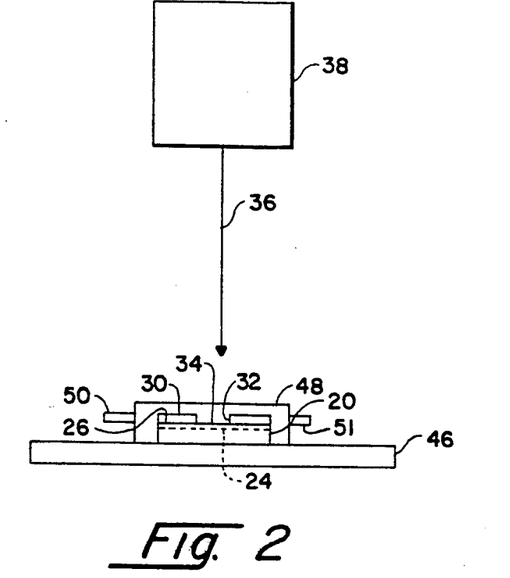
FIG. 2 is a schematic side view in elevation of a solar cell substrate and a laser showing the technique used to form microscopically-sized holes and larger sized apertures in a dielectric coating on the upper surface of a P-N solar cell substrate.

Referring to FIG. 2, removal of selected portions of coating 30 so as to expose portions of the upper surface of the substrate is accomplished using a laser beam 36 generated by a laser 38 positioned adjacent the substrate. Preferably laser 38 includes an optical assembly (not shown) for causing laser beam 36 to move bidirectionally along the orthogonal X and Y axes of substrate 20. Alternatively (or additionally) substrate 20 may be mounted on a conventional X-Y table 46 to permit the substrate to be moved bidirectionally along the orthogonal X and Y axes relative to laser beam 36. Relative movement of substrate 20 and laser beam 36 is controlled so as to form the desired grid electrode pattern, e.g., the pattern shown in FIG. 3 or a pattern as shown in U.S. Pat. No. 3,686,036.

The intensity and duration of exposure of laser beam 36 are selected so as to effect removal of selected portions of the dielectric coating 30 without the beam penetrating P/N junction 24 or otherwise causing deterioration of that junction.

Preferably, although not necessarily, the laser etching step is performed in an inert atmosphere. To this end, substrate 20 is preferably enclosed in a chamber 48 (FIG. 2) having a transparent top wall capable of passing the laser beam, and an inert gas such as argon is circulated through the chamber via ports 50 and 51 so as to wash across the top surface of the substrate. Preferably, the velocity of the feed gas is about 25 meters per minute.

As noted above, the present invention improves over prior art electrode forming methods, e.g., the laser method described in copending U.S. patent application Ser. No. 387,854 filed 7/31/89 by Hanoka et al for "Method of Fabricating Solar Cells", and the techniques disclosed by Lindmayer and Arndt et al., by providing a method whereby the grid pattern formed in the dielectric is characterized by a plurality of mutually spaced microscopic-size openings that are filled with a conductive metal, with the conductive metal in those openings being connected by a metal coating that overlies intervening portions of the dielectric. Therefore, for the purposes of this invention, the laser 38 must be capable of being operated, and must be operated, so that in the laser etched pattern formed in coating 30 at least the fingers or pickup bars 32 (and preferably also the bus bars 33) are defined by a series of very small mutually spaced circular holes. For this invention, it is preferred that the laser 38 be a neodium YAG (Nd:YAG) laser as the laser 38, and also that the laser be controlled so as to have a radiation wavelength of 1.06 microns. Also it is preferred that laser 38 be operated so as to have a nominal pulse rate of about 10 kHz and a pulse width of about 260 nanoseconds. It also is preferred to operate laser 38 so that (1) its incident power is about 50 to 75 mega-watts per square centimeter, and (2) the effective radiation area of the laser beam (i.e,, the cross-section of the beam where it contacts the substrate) is circular or substantially circular. The diameter of the beam should be in the range of about 10 to about 250 microns, with the diameter preferably being in the range of 20–50 microns.

Figure 4:
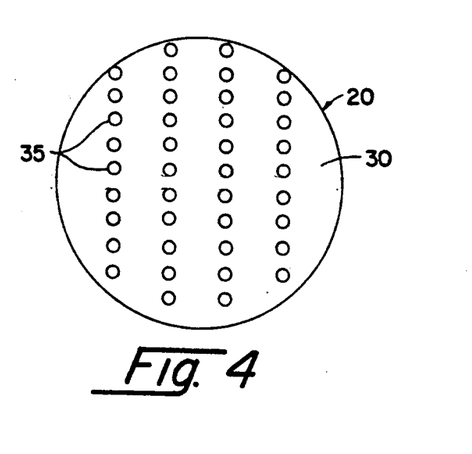
FIG. 4 is a fragmentary plan view on an enlarged scale of some of the fingers of the grid electrode pattern of FIG. 3, illustrating that each finger pattern comprises a plurality of very small circular holes in the dielectric layer.

According to this invention, laser beam 36 is caused to move relative to substrate 20, or vice versa, so that each of the fingers 32 of the grid electrode pattern in the dielectric layer 30 consists of a single series of mutually spaced holes 35 (FIG. 4) that are aligned in a row and correspond substantially in size and configuration to the radiation spot of the laser beam, i.e., are circular and have a diameter in the range of about 10 to about 250 microns, with a diameter of about 20–50 microns being preferred. Additionally the laser is operated so that the holes 35 are separated from one another by a distance in the range of about 1 to about 20 microns measured edge to edge, with a spacing about 1 to 5 microns measured edge to edge being preferred. Satisfactory, although less than optimal, results are obtained when the edge-to-edge spacing of holes 35 is in the range of about 5 to about 20 microns. While each of the bus bar sections 33 may be formed as a single relatively wide but elongate aperture, it is preferred that they be formed by several parallel rows of holes 35, with the holes in each row being shaped, sized and spaced like the holes 35 in the single rows that define finger sections 32. Additionally the several rows of holes that make up bus bar sections 33 are spaced from one another by a distance in the range of from 1 to 40 microns measured from the edge of a hole in one row to the edge of the nearest hole in the next adjacent row. Preferably from 3 to 6 rows of holes 35 are provided to form each bus bar section 33. Preferably but not necessarily, the rows making up each bus bar section are arranged so that each hole 35 of one row is aligned with the corresponding holes in each adjacent row.

It is preferred that the holes 35 be formed by moving the radiation spot relative to the substrate at a scan speed of between $\frac{1}{2}$ and 40 inches per second, with frequency and lamp current being adjusted with scan speed while maintaining incident power in the 50–75 mega-watt/cm$^2$ range. Laser 38 may be operated in either the fundamental mode or in the multi-mode. In the fundamental mode there is a gaussian intensity across the entire spot, whereas in the multi-mode the intensity varies irregularly across the spot. Operation in the fundamental mode is preferred for uniformity of results.

The radiation spot is preferably moved relative to the substrate by selective control of the optical assembly (not shown) associated with laser 38. Alternatively, the radiation spot may be fixed and the substrate moved relative thereto by appropriate manipulation of X-Y table 46.

The exact nature of the physical and/or chemical reaction between laser beam 36 and dielectric coating 30 responsible for the removal of selected portions from the coating 30 so as to expose portions 34 of substrate 20 is not entirely understood. It is believed, however, that when the dielectric coating 30 is made from silicon nitride, the Nd:YAG laser beam removes silicon nitride coating 30 by a combination of melting and evaporation.

The laser etching causes portions of the shallow P/N junction located below holes 35 to be driven deeper into the substrate, so as to provide a stepped junction characterized by relatively deep portions 24A (FIG. 1) located in line with holes 35. By providing locally deep junction regions 24A, the surface of the substrate exposed by holes 35 can be cleaned by chemical etching without decreasing the thickness of the N+ region to an unacceptably thin level.

As the next step, it is preferred that the rear side of substrate 20 be coated with a layer 58 of a conductive metal, preferably with a layer of aluminum. Use of an aluminum back electrode is well known. The aluminum layer 58 may be applied by screen printing or other suitable technique, e.g., evaporative deposition. Preferably layer 58 is produced by applying to the substrate an even coating of a composition comprising an aluminum powder in a volatile organic vehicle. A suitable aluminum paste for this purpose is disclosed in U.S. Pat. No. 4321283. That layer is then heated by heating the substrate for about 0.25 to 2.0 minutes to a temperature greater than 575° C. to remove the organic components of the paste and alloy the aluminum to the silicon substrate. In this alloying step, if the substrate has an N+ region at the back side thereof formed as a result of the diffusion step, the aluminum coating 58 alloys with the back side of the substrate so as to annihilate the N+ region and form a shallow P+ region 59 (FIG. 1). Typically the P+ region has a depth of from 1 to about 10 microns.

Thereafter nickel (or another metal with high electrical conductivity and ohmic contact capability, e.g., cobalt, palladium or platinum) is deposited in all of the openings formed in dielectric coating 30 by laser action. However, it is usually necessary to remove impurities from the exposed and coated areas of the substrate before conducting the metal deposition. This is preferably accomplished by a liquid etching procedure.

Accordingly, in the preferred mode of practicing the invention, the next step (still referring to FIG. 1) is to immerse substrate 20 for a selected period of time in a conventional buffered oxide etch solution of a type commonly used in the semiconductor industry for the purpose of removing silicon dioxide and other impurities from silicon. This immersion etching operation removes impurities from the exposed areas of the front surface of the substrate and coating 30, as well as from the aluminum coating on the rear side of the substrate. A preferred buffered oxide etch solution comprises (by weight) 40% ammonium fluoride buffering salts, 10-12% hydrofluoric acid by weight, and water. Substrate 20 is preferably immersed for about 30 seconds in the buffered oxide etch solution while the latter is maintained at a temperature of about 20° C. Of course, the required length of the immersion will vary with the temperature and composition of the buffered oxide etch solution. Then, substrate 20 is removed from the buffered oxide etch and is rinsed with de-ionized water.

The foregoing etching step is preferably, but not necessarily, followed by a second etching operation designed to remove any residue remaining or resulting from the laser etching step. Typically such residue may comprise small specks of the dielectric material on substrate 20 in the areas exposed by openings 32 and 33 in dielectric coating 30. This second etching operation involves immersing substrate 20 in a high ratio etch comprising nitric acid and hydrofluoric acid in a ratio of between about 50:1 and 1000:1 by volume, preferably about 300:1 by volume. Substrate 20 is immersed in the high ratio etch for a period of time that will vary with the temperature of the etch bath but is at least great enough to effect relatively rapid removal of the silicon nitride residues. When a 300:1 etch solution is used, it is preferred that the etch bath be at a temperature of about 12° C. and substrate 20 be immersed therein for about 20 seconds. These conditions assure elimination of silicon nitride residues. However, it should be noted this second etching operation may be carried out at a temperature higher than 12° C. Thus for example, an immersion time of about 8-15 seconds is adequate to remove all residual silicon nitride when the 300:1 etch is maintained at room temperature, i.e., about 25 degrees C. At the conclusion of the second etching operation, the substrate 20 is rinsed with de-ionized water.

Whatever material may have been loosened or detached by the laser action and which remains after the laser etch is completed, will tend to adversely affect the adherence of the metal used to form the grid electrode. The buffered oxide etch and high ratio etch steps serve to assure that those residues are removed, so that the subsequently formed electrodes will adhere securely to substrate 20.

It is recognized that under certain conditions and for certain applications, it may be possible to obtain adequate adherence of the grid electrode to the exposed portions 34 of substrate 20 without subjecting the substrate to the buffered oxide etch and high ratio etch. Accordingly, as indicated above, at least the high ratio etch step should be regarded as optional, but preferred. On the other hand, it should be understood also that the buffered oxide etch step may be omitted while retaining the high ratio etch step. This latter alternative method is feasible only if the duration of the high ratio etch step is increased. However, the duration of the high ratio etch step must not be so great as to cause excess etching of the substrate, e.g., etching that will adversely affect the P-N junction or the efficiency of the finished solar cell.

Thereafter nickel (or another suitable metal as noted above) is deposited in all of the openings and apertures formed in dielectric coating 30 by the laser action. The deposition of nickel or other suitable metal in the openings formed in dielectric coating 30 may be accomplished in various ways known to persons skilled in the art, e.g., by an immersion or electroless plating process. Preferably nickel is plated in all of those openings and apertures by an immersion plating process similar to the one disclosed in U.S. Pat. No. 4,321,283 issued to Patel et al. The plating is effected so that (1) the microscopically-sized holes 35 that define the general form of the grid pattern sections 32 and 33 are filled with a nickel "dot" 60, and (2) a nickel layer 62 is formed in covering relation to the rear side aluminum layer 58. The immersion plating is effected to control the thickness of dots 60 to about 2000 Angstrom units.

Subsequent to the immersion plating step, metal dots 60 may, but need not, be sintered. Preferably the sintering is conducted, in which case it is effected in a nitrogen atmosphere, preferably for 15-40 minutes at a temperature of about 300° C. A higher temperature may also be used.

Thereafter, depending on the particular process used to make the P-N junction, it may be necessary to further treat the substrate to isolate the P and N layers from one another so as to avoid short circuiting of the P-N junction. Thus, if formation of the P-N junction was accomplished by a diffusion process whereby diffusion of N-type dopant occurred on the side edges as well as the front and rear sides of the substrate, junction isolation is required and may be accomplished by sawing off or otherwise removing a portion of the substrate at each of its four sides.

Figure 5:
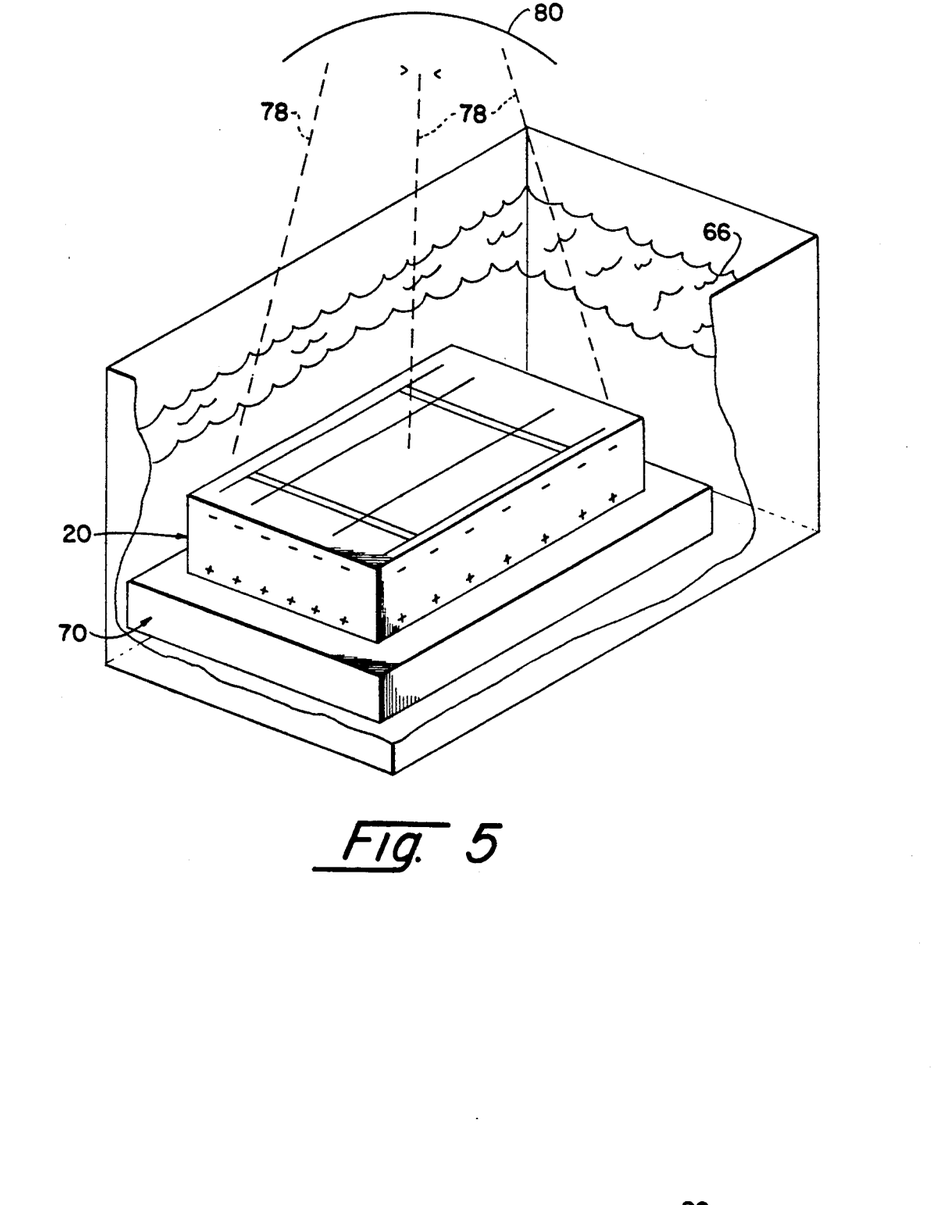
FIG. 5 is a schematic perspective view illustrating how light-induced plating ("LIP") is used in practicing the present invention.
Figure 6:
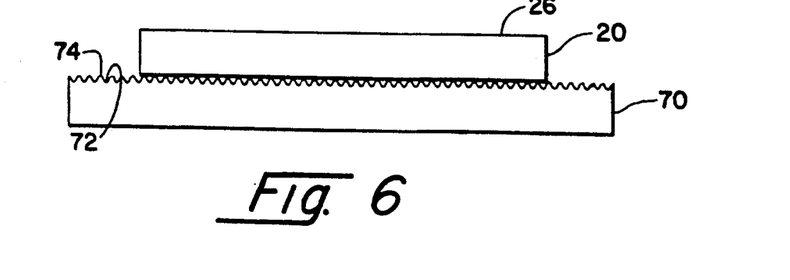
FIG. 6 is a side view in elevation of a solar cell substrate and a metal support therefor used in practicing the light-induced plating method.

Referring now to FIGS. 1, 5 and 6, as the next step the metal dots 60 are overcoated and interconnected by deposition of a coating of a selected metal that may or may not adhere to the dielectric coating. Preferably the selected metal is copper. In this connection, it should be noted that copper does not adhere readily to silicon nitride. Preferably but not necessarily, the copper is applied by a contactless light-induced plating ("LIP") method which relies on the photovoltaic characteristic of substrate 20 to provide the necessary electromotive driving force for the plating reaction.

To effect this LIP plating process, a bath 66 (FIG. 4) of a suitable electrolytic medium is provided. The specific composition of the electrolyte bath 66 will vary as a function of the metal to be overcoated on metal dots 60. If copper is to be deposited on metal dots 60, a suitable electrolyte bath comprises a solution of $CuSO_4*5-H_2O$ at 100 grams per liter ($+/-50$ g/l) of deionized water, plus 100 cc ($+90/-9$) of 96/98% sulfuric acid per liter of deionized water. If silver instead of copper is to be deposited on metal dots 60, a suitable electrolytic bath comprises a solution of silver cyanide. Other suitable electrolytic bath solutions will obvious to persons skilled in the art.

A support plate 70 (FIGS. 5 and 6) made from the selected metal that is to overcoat the nickel deposits, or consisting of a plate made from a different metal or plastic material but covered with a layer of that selected metal, is disposed in the electrolyte bath. If copper is the preferred metal, plate 70 is made of copper. Preferably its top surface includes a plurality of elongate parallel grooves 72, so as to leave ridges 74. Substrate 20 is positioned so that its aluminum covered rear surface rests on ridges 74, as shown in FIG. 6. Grooves 72 serve as passages to vent any $O_2$ gas which may tend to build up between plate 70 and the back surface of substrate 20 as a result of the light-induced plating process. Without such venting, the $O_2$ gas might lift substrate 20 out of electrical contact with plate 70. The level of the electrolyte bath 66 is selected so that the substrate 20 is fully immersed therein.

Next, the front surface of substrate 20 is exposed to electromagnetic radiation 78 generated by a source 80 which is selected so that the spectrum of its electromagnetic radiation includes those wavelengths which will induce a photovoltaic response in substrate 20. The wavelength spectrum of the electromagnetic radiation generated by source 80, and the composition of the electrolytic bath 66 in which the substrate 20 is immersed, are additionally selected so that substantially none of the electromagnetic radiation from source 80 will be absorbed by the bath. By this matching of the wavelength of radiation 78 with the transmissivity of the electrolytic bath, very little heating of the bath occurs during the plating process. In this connection, it should be noted that bath 66 is preferably maintained at a temperature ranging from 28° to 34° C. and that a metal halide/mercury vapor long arc type street lamp is a suitable choice for source 80.

When the front surface of substrate 20 is exposed to electromagnetic radiation 78, a photovoltaic response is generated, causing an ionic current to be produced in bath 66 and causing the metal dots 60 to be negatively charged. At the same the aluminum layer becomes positively charged. The negatively-charged metal dots 60 attract positive copper ions from the electrolytic bath, with the result that a layer of copper 86 (FIG. 1) is plated onto each of the metal dots 60. As copper ions are drawn out of the electrolytic bath by the plating process, replacement copper ions dissolve from support plate 70 so as to maintain the copper ion concentration in the electrolytic bath at equilibrium. It has been determined that copper deposition caused by the LIP plating process will tend to grow laterally as well as vertically. Accordingly, if the light-induced plating process is allowed to proceed for a suitable period of time, the deposited copper will extend beyond the perimeter of the each of the dots 60 so as to interconnect adjacent dots. Such bridging is dependent upon the spacing between the holes 35. However, if the holes 35 have a maximum edge-to edge spacing of about 20 microns or less, the copper deposits 86 can be formed so as to bridge and interconnect adjacent dots 60, as shown at 87 in FIG. 1. Such bridging also occurs between the adjacent rows of dots 60 that fill the holes 35 in the plurality of closely spaced rows that make up the bus bar sections 33 of the grid electrode plating pattern shown in FIG. 3. In essence, as a consequence of the light-induced plating process, the deposited copper will extend over the silicon nitride layer between adjacent nickel dots 60 in each finger section 32 and also in each bus bar section 33, so as to form a continuous grid electrode on the front side of the substrate having a relatively low metal to silicon contact area.

When copper is to be plated by the LIP method as described above, the intensity of the output radiation of source 80 is controlled so that copper is deposited at a thickness growth rate of about 0.1 to about to 1.5 microns per minute. Typically, the aspect ratio, i.e., the ratio of vertical to horizontal dimensions (optionally described as the thickness to breadth ratio) of the copper growth is about 1 to 1. A ratio of 1.3 to 1 may be achieved achieved by controlling the intensity of the output of source 80 so that copper is deposited at a thickness change rate of 0.5 microns of per minute, and such ratio is preferred. In this connection, it is to be understood that the breadth (i.e., the horizontal dimension) of copper layer 86 must exceed the diameter of metal dots 60 on which they are deposited, in order for the copper to interconnect those dots as shown at 87. Thus it is essential and preferred that the light-induced plating process be continued for a period of time sufficient to cause copper layer 86 to grow beyond the perimeter of holes 35 by an amount sufficient to form the interconnecting or bridging portions 87. Preferably the copper plating process is continued long enough for the bridging portions 87 of the copper layer to have a thickness of 10–40 microns, with a thickness of about 20 microns being optimum.

However, the LIP plating process must be controlled so as to prevent the copper layer 86, 87 from becoming excessively stressed. Thus an excessively rapid rate of deposit should be avoided to reduce or eliminate stress on dots 60. An excessively thick layer of copper may tend to apply stress to nickel dots 60, which in turn may cause the dots to separate from the underlying silicon substrate. Thus the thickness of connecting portions 87 should not exceed about 40 microns to avoid excessive stressing of dots 60.

In the event that the layer 86 is to be made from silver, the intensity of radiation 78 generated by source 80 is controlled so that silver is deposited at about 0.5 to 2.0 microns of thickness per minute.

With a light-induced plating process as above described, there is no need for connecting any of the components to a separate voltage source. In this regard, it should be appreciated that support plate 70 is not a source of positive potential. It should be noted also that support plate 70 limits exposure of the rear surface of substrate to the bath, thereby reducing the rate of possible degradation of the back surface contact by the electrolytic bath.

EXAMPLE

Referring to FIGS. 1-5, a metallized front-surface electrode is applied to a silicon solar cell substrate in accordance with the process described above. The solar substrate 20 is a plate of P-type silicon grown by the EFG method and includes a P/N junction 24 disposed about 0.5 microns from the front surface 26 of the substrate. The front surface 26 of substrate 20 is covered with a silicon nitride layer 30 having a thickness of about 850 Angstroms.

As the first step in the process, a plurality of mutually spaced circular holes 35 having a diameter of about 20 microns is formed in dielectric layer 30 using laser 38, in accordance with the procedure described above. The holes are arranged so that together they defined a grid electrode as shown in FIG. 3, with each finger section 32 comprising a single row of holes 35 and each of the two bus bar sections consisting of 4 rows of like holes. The fingers are spaced from one another by about 4 mm. The bus bar sections extend for almost the full length of the substrate. The laser beam is controlled so each hole has a diameter of about 20 microns and the holes in each row are spaced from each adjacent hole in the same row by about 3 microns (measured edge-to-edge). The 4 rows of holes forming each bus bar section 32 are spaced from one another by a distance of about 40 microns measured from the edges of adjacent holes. The holes in each row making up a bus bar section 33 are aligned with the corresponding holes in each adjacent row.

Next the back side of substrate 20 is coated with an aluminum paste by a conventional screen printing process. Then the substrate is heated for about 0.25 to 2.0 minutes at a temperature of about 600 degrees C., so as to remove volatile and pyrolyzable organic compounds in the screen printing paste and to alloy the aluminum in the paste to the silicon substrate, thereby forming aluminum electrode 58 alloyed to the substrate.

Then, substrate 20 is immersed in a buffered oxide etch bath comprising by weight 40% ammonium fluoride buffering salts, 10-20% hydrofluoric acid by weight, and water for about 30 seconds. The buffered oxide etch solution was maintained at a temperature of about 20° C. Thereafter, substrate 20 is removed from the buffered etch, and rinsed with deionized water.

Next it is immersed in a high ratio etch comprising nitric acid and hydrofluoric acid in a ratio of about 300:1 by volume for about 20 seconds. The high ratio etch was maintained at a temperature of about 12° C. Substrate 20 is then removed from the high ratio etch and rinsed with deionized water.

Following rinsing, nickel is deposited by the immersion plating process described in U.S. Pat. No. 4,321,283 onto the aluminum contact 58 on the back surface of substrate 20 and onto those portions of the front surface of the substrate that are exposed by holes 35. The immersion plating process is effected so that nickel is deposited in holes 35 so as to produce dots 60. Enough nickel is deposited in each hole to assure that the dots 60 will be about 2,000 angstroms thick. Thereafter the nickel deposits are sintered in a nitrogen atmosphere at a temperature of about 300° C. for about 15 to 40 minutes.

Next, the nickel dots 60, but not nickel layer 62 on the back surface of the substrate, are over-plated with copper using the light-induced plating method described above. An electrolytic bath is used which comprises a solution of $CuSO_4*5H_2O$ at 100 grams per liter of deionized water, plus 10 cc of 98% sulfuric acid per liter of deionized water. The silicon substrate is immersed in the bath so that its nickel layer 62 sits on the ridges 74 of a copper support plate 70. the bath is maintained at a temperature of about 28° C. to 34° C. A metal halide/mercury vapor long arc type street lamp having its primary spectral radiation in the blue/green visible range is used as source 80. The intensity of the light generated by the lamp is controlled so that copper is deposited at a rate of about 0.5 microns of thickness per minute. At this deposition rate, the plating will show a growth aspect ratio (thickness to breadth) of 1.3:1. The light-induced plating process is continued for a period of about 20 minutes, so as to cause the deposited copper to bridge the silicon nitride between holes 35 and so that those bridging portions 87 have a thickness of about 10 microns.

After the light-induced plating process is completed, the substrate 20 is removed from the electrolytic bath and rinsed with deionized water.

The resulting solar cell has a nickel front contact and a nickel-coated aluminum back contact, with the nickel dots coated and connected by a plating of copper. As a result the nickel dots 60 and the overlying copper 86, 87 define a continuous grid contact that serves as a current collector for the light-receiving front surface of the cell.

An important advantage of the present method of forming and applying metallized conductors is that the metal to silicon contact area ratio is improved significantly as compared to solar cells having grid contacts comprising conductors that contact the substrate along their entire lengths. Despite the fact that only portions (the nickel dots 60) of the grid electrode make direct contact with the substrate, solar cells made according to this invention exhibit a relatively high solar cell efficiency and a relatively high fill factor. More importantly, because of the decrease in the amount of metal in contact with the underlying substrate, the open circuit voltage $V_{oc}$ of the solar cell is improved.

It is to be noted that if the microscopicallysized holes 35 in a row of holes are spaced too far apart, i.e. more than 20 microns, the performance of the solar cell will typically drop off due to poor connection of the conductors to the substrate, and shadowing. Regarding the latter factor, using the LIP plating method, if copper layer 86 is permitted to grow sufficiently to bridge a gap of more than about 20 microns between adjacent metal dots 60, the width of the electrodes, which increases concurrently with increases in height, may be sufficient to create an undesirably large amount of shadowing of the front surface of the solar cell. Therefore, as noted above, it is preferred that in each row the holes 35 be spaced 1 to 5 microns apart, measured edge-to-edge.

As noted above the laser etching has the effect of driving the junction 24 deeper in the regions below where holes 35 are formed, as shown at 24A. The junction depth is increased from about 0.5 microns to about 3.0 microns by the laser action. The localized increases in junction depth are believed to reduce recombination losses. The formation of a locally deep junction is especially important when the initial junction is shallow, e.g., about 0.5 microns deep, in respect of enhancing the blue sensitivity of the cell. Notwithstanding the fact that the dopant concentration at the surface of the substrate in the region of holes 35 cell is reduced as a consequence of the stepped junction formation, the nickel dots make a good ohmic contact with the substrate.

Another important advantage of the present invention is that use of the LIP plating method permits relatively small and/or thin, fine metallic conductors of uniform thickness to be repeatably applied to solar cell substrates.

It is obvious to persons skilled in that art that certain changes may be made in the process described herein without departing from the scope of the invention. Thus, for example, silver may be substituted for nickel as the base layer for the front grid electrode. Also silver instead of copper may be used over the nickel dots. It is also noted that the copper or silver may be applied to the silver dots by other electroless or electrolytic plating methods. However, those methods offer the disadvantage that copper or silver will be deposited over the nickel on the back electrode, an unnecessary and hence costly step. Similarly the order of steps in the preferred method of practicing the present invention may be altered according to economic necessity or because of preferences or requirements of the manufacturer. Thus, for example, the aluminum back electrode may be formed after formation of the front grid electrode. Further the operating conditions such as temperature and time, and also the composition of the various materials used in the preferred embodiment of the invention, may be changed in accordance with preferences of persons skilled in the art. Therefore, it is intended that all matter contained in the above description or shown in the accompanying drawings shall be interpreted in an illustrative and not in a limiting sense.

As used herein, "metal to silicon contact area ratio" refers to the ratio of the area of a surface of a substrate to which is attached a metal conductor, divided by the total area of that surface. Also a "microscopically-sized" hole or opening is one that has a diameter not exceeding about 250 microns. The term "microns" means $1 \times 10^{-6}$ meters.

What is claimed is:

1. A method of forming an electrode grid on the front surface of a solar cell substrate comprising the following steps:
   providing a silicon solar cell substrate having front and back surfaces, a p/n junction adjacent said front surface, and a dielectric coating on said front surface; and
   subjecting said dielectric coating to a laser beam of an intensity and for a duration sufficient to remove selected portions of said dielectric coating and thereby form in said dielectric coating an electrode pattern comprising a a plurality of finger-like sections, with said said laser beam being controlled so that each of said fingers comprises a plurality of microscopically-sized holes in said dielectric coating with said holes being spaced from one another a selected distance not exceeding 20 microns.

2. A method according to claim 1 further including the step of subjecting said substrate to chemical etching following said laser etching, whereby to effect removal of impurities.

3. A method according to claim 1 further comprising the step of covering those areas of said front surface that are exposed by said holes with a selected conductive metal.

4. A method according to claim 2 further comprising the step of covering those areas of said front surface that are exposed by said holes with a selected conductive metal.

5. A method according to claim 4 wherein said step of covering said areas with a selected conductive metal is accomplished by immersion plating.

6. A method according to claim 4 further including the step of covering said selected conductive metal with a second conductive metal.

7. A method according to claim 6 wherein said second conductive metal is copper or silver.

8. A method according to claim 6 wherein said step of covering said selected conductive metal with a second conductive metal is accomplished by a method whereby said second conductive metal overlies said selected conductive metal in said microscopically-sized holes and also extends between said holes in covering relation with the dielectric coating located between said holes.

9. A method according to claim 8 wherein said second conductive metal is deposited onto said selected conductive metal by an electrolytic plating process.

10. A method according to claim 8 wherein said second conductive metal is coated onto said selected conductive metal by a light-induced plating process.

11. A method according to claim 10 wherein said second conductive metal is deposited onto said selected conductive metal by a method comprising the following steps:
    immersing said substrate in an electrolytic bath containing said second conductive metal;
    exposing said front surface of said substrate to electromagnetic radiation comprising wavelengths that are absorbed by said substrate and thereby generate a photovoltaic response, so as to cause said solar cell substrate to generate current in said bath; and
    continuing said exposure for a period of time sufficient to cause the deposition of said second selected metal onto said selected metal.

12. A method according to claim 11 wherein said electromagnetic radiation has a wavelength spectrum selected so that only a minor portion, if any, of said radiation is absorbed by said electrolytic bath.

13. A method according to claim 11 wherein said substrate is maintained with its back surface in contact with a layer of said second selected conductive metal during the while that said front surface is exposed to said radiation.

14. A method according to claim 13 wherein said layer of said second selected conductive metal is a plate and has plurality of elongate grooves in one surface thereof facing said substrate.

15. A method according to claim 11 wherein said second electrically-conductive metal is copper and said bath comprises $CuSO_4 \cdot 5H_2O$.

16. A method according to claim 3 wherein said selected electrically-conductive metal is nickel or silver.

17. A method according to claim 16 wherein said second electrically-conductive metal is copper or silver.

18. A method according to claim 17 wherein said second electrically-conductive metal is copper.

19. A method according to claim 17 wherein said second electrically-conductive metal is silver.

20. A method according to claim 1 wherein said holes are spaced from one another by a distance in the range of between 1 and 20 microns measured edge-to-edge.

21. A method according to claim 1 wherein said holes have a substantially circular cross section and a diameter ranging from 10 to 250 microns.

22. A method according to claim 6 wherein said second conductive metal is deposited with a thickness ranging from 10 to 40 microns.

23. A method according to claim 4 further including the step of immersing said solar cell substrate in a buffered oxide etch and then a high ratio etch comprising nitric acid and hydrofluoric acid etch prior to plating said substrate with said first-mentioned metal.

24. A method according to claim 1 wherein a YAG laser is used to generate said laser beam.

25. A method of forming an electrode grid on the front surface of a solar cell substrate comprising the following steps:
providing a silicon solar cell substrate having front and back surfaces, a p/n junction in said substrate adjacent said front surface, and a silicon nitride coating on said front surface, said substrate being capable of generating a photovoltaic response when said front surface is exposed to electromagnetic radiation;
removing portions of said dielectric layer so as to expose portions of said front surface, with removal of said dielectric being accomplished so as define therein an electrode pattern comprising at least a plurality of elongate finger sections, with each finger section comprising and being defined by a plurality of small mutually-spaced holes in said dielectric layer through which said front surface is exposed;
filling said holes with a first conductive metal;
and over-coating said first conductive metal with a second conductive metal so that said second conductive metal extends over said silicon nitride between said holes, thereby providing and electrical connection between the deposits of said first conductive metal in said holes.

26. A method according to claim 25 wherein said first conductive metal is nickel or silver.

27. A method according to claim 26 wherein said second conductive metal is copper or silver.

28. A method according to claim 25 wherein said first electrically conductive metal is deposited by an immersion plating process.

29. A method according to claim 25 wherein said second electrically conductive metal is deposited by a light-induced plating process.

30. A method of fabricating a solar cell comprising the following step:
forming a p/n junction in a silicon substrate adjacent a front surface of said substrate;
applying a dielectric layer to said front surface;
subjecting said dielectric coating to a laser beam of an intensity and for a duration sufficient to eliminate selected portions of said dielectric coating, said laser beam being controlled so that said selected portions comprise a plurality of rows of microscopically-sized holes, with the holes in each row being spaced from one another by an amount not exceeding 20 microns;
applying an aluminum electrode to the back surface of said substrate;
plating a first selected electrically conductive metal over said aluminum electrode and also on to those areas of said front surface exposed by said holes;
immersing said substrate in an electrolytic bath containing a second selected electrically conductive metal;
exposing said front surface of said substrate to electromagnetic radiation comprising wavelengths that are absorbed by said substrate, so as to cause said substrate to generate current in said bath; and
continuing said exposure for a period of time sufficient to cause the deposition of said second selected electrically conductive metal onto said first electrically conductive metal in said holes and also onto those portions of the surface of said silicon nitride layer that extend between said holes.

31. A method of making a metallization pattern on a photovoltaic cell substrate comprising in sequence the steps of:
(a) providing a flat silicon substrate having a P/N junction formed therein adjacent one side thereof and a layer of silicon nitride covering the surface of said substrate at said one side; and
(b) scanning selected portions of said silicon nitride layer with a laser beam of an intensity and for a duration sufficient to (1) remove said selected portions so as to form apertures in said silicon nitride layer through which selected areas of said surface are exposed, and (2) drive those portions of said P/N junction positioned below said selected areas more deeply into said junction.

32. A method according to claim 31 wherein said apertures are microscopically-sized holes spaced from one another by a distance not exceeding 20 microns.

* * * * *

UNITED STATES PATENT AND TRADEMARK OFFICE
CERTIFICATE OF CORRECTION

PATENT NO. : 5,011,565

DATED : April 30, 1991

INVENTOR(S) : Christopher E. Dube et al

It is certified that error appears in the above-identified patent and that said Letters Patent is hereby corrected as shown below:

Claim 25, column 15, line 24, change "dielectric layer" to -- silicon nitride coating --;

Claim 25, column 15, line 26, change "dielectric" to -- silicon nitride coating --;

Claim 25, column 15, line 31, change "dielectric layer" to -- silicon nitride coating --;

Claim 25, column 15, line 37, change "and" to -- an --;

Claim 30, column 16, line 17, change "on to" to -- onto --.

Signed and Sealed this

Twenty-fourth Day of November, 1992

*Attest:*

DOUGLAS B. COMER

*Attesting Officer*     *Acting Commissioner of Patents and Trademarks*